Sept. 22, 1970 J. C. H. DAVIS 3,529,616
FLUID OSCILLATORS
Filed Jan. 3, 1969
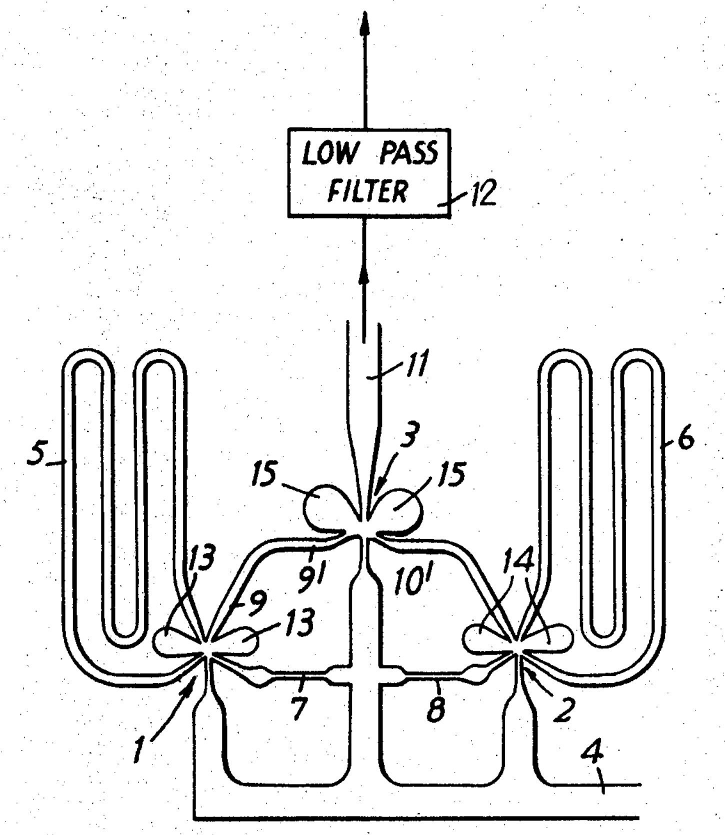
INVENTOR
JOHN CHRISTOPHER HAMMOND DAVIS
BY Young + Thompson
ATTYS.

United States Patent Office 3,529,616

Patented Sept. 22, 1970

3,529,616

FLUID OSCILLATORS

John Christopher Hammond Davis, Taplow, England, assignor to British Telecommunications Research Limited, Taplow, England, a British company Filed Jan. 3, 1969, Ser. No. 788,798
Int. Cl. F15c *1/06, 1/14*
U.S. Cl. 137—81.5 4 Claims

ABSTRACT OF THE DISCLOSURE

The outputs of two fluid delay line oscillators made from materials having different coefficients of expansion are combined to produce a beat frequency output. The materials of which the delay lines are made are chosen so that the output beat frequency is substantially invariant with temperature over a wide range of temperatures.

This invention relates to pure fluid oscillators and more particularly to fluid delay line oscillators.

Most pure fluid oscillators are sensitive to changes in pressure or temperature or both. The oscillation frequency of a delay line oscillator is theoretically independent of pressure although in practice this is found to be not strictly true. However, such frequency is proportional to the square root of absolute temperature T. It is an object of the invention to provide a fluid delay line oscillator arrangement in which the output frequency is relatively insensitive to temperature when compared with a basic fluid delay line oscillator.

The frequency of a fluid delay line oscillator is also inversely proportional to the delay line length 1. Consequently it is theoretically possible to compensate for temperature changes by arranging for the delay line to expand so that the expression $\sqrt{T/1}$ remains constant. However, for operation around 300° K., the delay line would have to be made from a material having a coefficient of expansion of $\frac{1}{600}$ per ° C. There is no usable solid at present available having such a large coefficient of expansion.

According to the invention, a pure fluid oscillator comprises a first fluid delay line oscillator, the delay line of which has a first length at the mean operating temperature of the oscillator and is made of a material of a first coefficient of expansion, a second fluid delay line oscillator, the delay line of which has a second length at said mean operating temperature and is made of a material having a second coefficient of expansion and mixer means responsive to the oscillations produced by the first and second delay line oscillators for producing an output signal having an output frequency equal to the difference between the operating frequencies of said first and second delay line oscillators, the relationship between the first and second lengths and the first and second coefficients of expansion being such that the frequency of said output signal is substantially constant.

An embodiment of the invention will now be described with reference to the accompanying schematic drawing which shows two pure fluid proportional amplifiers 1, 2 and a modulator 3 sharing a common power supply 4. One output of each amplifier is fed back via a respective delay line 5, 6 to the control port on the same side to provide negative feedback at low frequencies. The delay lines 5 and 6 have lengths $1_1$ and $1_2$, respectively, and the corresponding coefficients of expansion specified hereinafter. At a higher frequency the delay causes the feedback to each amplifier to be positive so that oscillation occurs with a period twice the value of the delay. The fed back DC component is approximately balanced in each amplifier by flows from the power supply 4 through resistors 7, 8 so that the oscillations are approximately symmetrical about the centre of each amplifier's characteristic. Since the two delay lines 5 and 6 are different in length, the frequencies at the outputs 9 and 10 of the amplifiers 1 and 2 respectively will differ in proportion to this difference.

The modulator 3 provides an output at 11 only when the signals at its inputs 9′ and 10′ (i.e., at the amplifier outputs) are equal, thus providing a full wave rectified version of the two inputs modulated together. A low-pass filter 12 (shown in block form) is connected to the output 11 to extract the difference or beat frequency therefrom.

The amplifiers 1 and 2 and the modulator 3 are provided with static pressure relief vents 13, 14 and 15, respectively.

The relative values to be given to $1_1$ and $1_2$ depend on the material chosen. If only the first order terms of the coefficients of expansion of the two materials are considered, the required relationship is given by $$\frac{1}{2T}=\frac{\alpha_2 1_1-\alpha_1 1_2}{1_2-1_1}$$

where T is the mean absolute temperature of the temperature range over which the oscillator is to operate, $1_1$ and $1_2$ are the lengths of the two delay lines at this temperature and $\alpha_1$ and $\alpha_2$ are the corresponding first order terms in the respective coefficients of expansion. If the oscillator is constructed in accordance with this formula, then, when T equals 300° K., a temperature deviation of 18° gives a frequency variation of 0.1%.

Considering second order terms in the coefficients of expansion as well as first order terms, the relationship between the length and the coefficients of expansion is given by $$\frac{3}{8T^2}=\frac{(\beta_2-\alpha_2^2)-(\beta_1-\alpha_1^2)}{1_2-1_1}$$

where $\beta_1$ and $\beta_2$ are the second order terms in the coefficients of expansion of the respective materials.

If T=300° K., a variation of temperature of ±18° C. produces a variation of 0.01% in the frequency. Temperature variations of up to ±42° C. can be tolerated without the frequency variation exceeding 0.1%.

Preferably one of the delay lines is made of an alloy containing 63.8% iron, 36% nickel and 0.2% carbon ("Invar"). At a temperature of about 300° K., the first order term in the coefficient of expansion of this material is negligibly small. Consequently, assuming that the delay line of length $1_1$ is made of Invar, the first order equality reduces to $$2\alpha_2 T=\frac{1_1}{1_2}-1$$

The other delay line is made of a material having a relatively high coefficient of expansion such as aluminium or copper. Although Invar and aluminium or Invar or copper do not completely satisfy the second order equality, the second order coefficient of expansion of Invar at 300° K. is such that a better result is achieved than would be obtained if Invar had zero second order term in its coefficient of expansion at this temperature.

As previously stated, the frequency of a fluid delay line oscillator is subject to small changes in frequency with pressure. However, since the two component oscillators of the beat frequency oscillator are identical except for the difference in length and since they work under identical conditions the effects of pressure changes on the two component oscillators tend to cancel out.

What we claim is:

1. A pure fluid oscillator comprising a first fluid delay line oscillator the delay line of which has a first length at the mean operating temperature of the oscillator and is made of a material of a first coefficient of expansion, a second fluid delay line oscillator the delay line of which has a second length at said mean operating temperature and is made of a material having a second coefficient of expansion and mixer means responsive to the oscillations produced by said first and second delay line oscillators for producing an output signal having an output frequency equal to the difference between the operating frequencies of said first and second delay line oscillators, the relationship between the first and second lengths and the first and second coefficients of expansion being such that the frequency of said output signal is substantially constant.

2. A fluid oscillator as claimed in claim 1, in which each of said first and second delay line oscillators comprises a pure fluid proportional amplifier having two control ports and two output ports and a delay line connected between one output port and the control port operative to direct a signal to the other output port and means for supplying a constant bias signal to the other control port.

3. A fluid oscillator as claimed in claim 1, in which the mixer device comprises a pure fluid modulator having a low-pass filter connected to its output.

4. A fluid oscillator as claimed in claim 1, in which the first delay line is made of an alloy comprising 63.8% iron 36% nickel and 0.2% carbon and the second delay line is made of a material having a coefficient of expansion equal to $$\frac{l_1-l_2}{2Tl_2}$$

where $l_1$ is said first length, $l_2$ is second length and T is said mean absolute operating temperature.

References Cited

UNITED STATES PATENTS

| | | | |
|---|---|---|---|
| 3,185,166 | 5/1965 | Horton et al. | 137—81.5 |
| 3,292,648 | 12/1966 | Colston | 137—81.5 X |
| 3,402,727 | 9/1968 | Boothe | 137—81.5 |
| 3,442,281 | 5/1969 | Warren | 137—81.5 |

M. CARY NELSON, Primary Examiner

W. R. CLINE, Assistant Examiner